United States Patent
Quinn et al.

(10) Patent No.: US 9,583,707 B2
(45) Date of Patent: Feb. 28, 2017

(54) MICRO-NOZZLE AND MICRO-NOZZLE ARRAY FOR OVJP AND METHOD OF MANUFACTURING THE SAME

(71) Applicant: Universal Display Corporation, Ewing, NJ (US)

(72) Inventors: William E. Quinn, Whitehouse Station, NJ (US); Gregory McGraw, Yardley, PA (US); Siddharth Harikrishna Mohan, Plainsboro, NJ (US); Matthew King, Evesham, NJ (US); Elliot H. Hartford, Jr., Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/858,840

(22) Filed: Sep. 18, 2015

(65) Prior Publication Data
US 2016/0083845 A1 Mar. 24, 2016

Related U.S. Application Data

(60) Provisional application No. 62/052,542, filed on Sep. 19, 2014.

(51) Int. Cl.
*H01L 51/00* (2006.01)
*B41J 2/16* (2006.01)
(Continued)

(52) U.S. Cl.
CPC ........ *H01L 51/0004* (2013.01); *B41J 2/1433* (2013.01); *B41J 2/162* (2013.01);
(Continued)

(58) Field of Classification Search
CPC . H01L 51/00; H01L 51/0004; H01L 51/0005; B41J 2/1433; B41J 2/1628; B41J 2/165
See application file for complete search history.

(56) References Cited

U.S. PATENT DOCUMENTS 4,769,292 A 9/1988 Tang et al.
5,247,190 A 9/1993 Friend et al.
(Continued)

FOREIGN PATENT DOCUMENTS

WO 2008057394 5/2008
WO 2010011390 1/2010

OTHER PUBLICATIONS

Arnold, "Direct vapor jet printing of three color segment organic light emitting devices for white light illumination", Applied Physics Letters; 92 053301 (2008).
(Continued)

*Primary Examiner* — Phuc Dang
(74) *Attorney, Agent, or Firm* — Morris & Kamlay LLP

(57) ABSTRACT

Embodiments of the disclosed subject matter provide a nozzle assembly and method of making the same, the nozzle assembly including a first aperture formed on a first aperture plate to eject a carrier gas flow having organic vapor onto a substrate in a deposition chamber, second apertures formed on a second aperture plate disposed adjacent to the first aperture to form a vacuum aperture, where the first aperture plate and the second aperture plate are separated by a first separator plate, third apertures formed on a third aperture plate to eject purge gas that are disposed adjacent to the second aperture plate, where the second aperture plate and the third aperture plate are separated by second separator plate, and a third separator plate is disposed adjacent to the one or more third aperture plates to form a gas channel in the one or more third aperture plates.

20 Claims, 13 Drawing Sheets

(51) Int. Cl.
  *C23C 14/22* (2006.01)
  *C23C 14/12* (2006.01)
  *C23C 14/24* (2006.01)
  *B41J 2/14* (2006.01)
  *H01L 51/50* (2006.01)

(52) U.S. Cl.
  CPC .......... *B41J 2/1628* (2013.01); *B41J 2/1631* (2013.01); *B41J 2/1642* (2013.01); *C23C 14/12* (2013.01); *C23C 14/22* (2013.01); *C23C 14/228* (2013.01); *C23C 14/24* (2013.01); *H01L 51/0005* (2013.01); *B41J 2002/14475* (2013.01); *H01L 51/50* (2013.01)

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,279,704 B2 | 10/2007 | Walters et al. |
| 7,404,862 B2 | 7/2008 | Shtein et al. |
| 7,431,968 B1 | 10/2008 | Shtein et al. |
| 7,744,957 B2 | 6/2010 | Forrest et al. |
| 7,879,410 B2 | 2/2011 | Che et al. |
| 7,897,210 B2 | 3/2011 | Shtein et al. |
| 7,968,146 B2 | 6/2011 | Wagner et al. |
| 8,293,329 B2 | 10/2012 | Forrest |
| 8,613,496 B2 | 12/2013 | Forrest et al. |
| 8,728,858 B2 | 5/2014 | Mohan et al. |
| 2003/0230980 A1 | 12/2003 | Forrest et al. |
| 2004/0174116 A1 | 9/2004 | Lu et al. |
| 2006/0061622 A1* | 3/2006 | Suzuki ............... B41J 2/14201 347/47 |
| 2008/0211870 A1* | 9/2008 | Owaki ............... B41J 2/14233 347/45 |
| 2009/0295870 A1* | 12/2009 | Goin ............... B41J 2/1433 347/47 |
| 2011/0097495 A1 | 4/2011 | Burrows et al. |
| 2013/0208036 A1 | 8/2013 | Forrest |
| 2014/0057390 A1* | 2/2014 | Mohan ............... H01L 51/0003 438/99 |
| 2014/0116331 A1 | 5/2014 | Forrest et al. |
| 2014/0138629 A1 | 5/2014 | Forrest et al. |

OTHER PUBLICATIONS

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

Biswas, et al., "Solvent-free, direct printing of organic semiconductors in atmosphere", Applied Physics Letters 96, 263301 (2010).

McGraw, "Organic vapor jet printing at micrometer resolution using microfluidic nozzle arrays", Applied Physics Letters 98, 013302 (2011).

Shtein, et al., "Direct mask and solvent-free printing of molecular organic semiconductors", Advanced Materials; 16 (18); pp. 1615-1620.

Yun, et al., "Digital-Mode Organic Vapor-Jet Printing (D-OVJP): Advanced Jet-on-Demand Control of Organic Thin-Film Deposition", Advanced Materials; c. 2012; vol. 24; pp. 2857-2862.

* cited by examiner

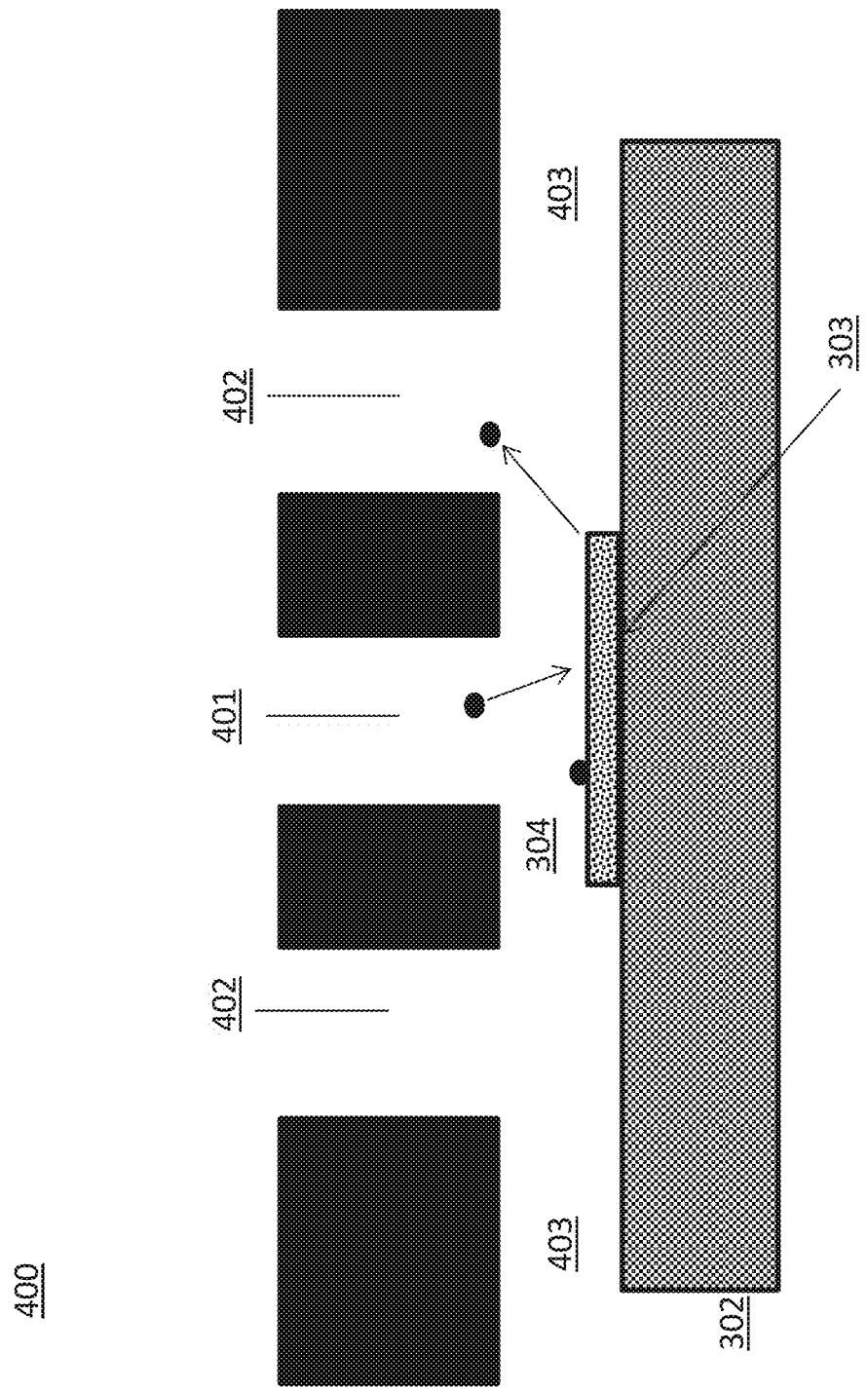

FIG. 6
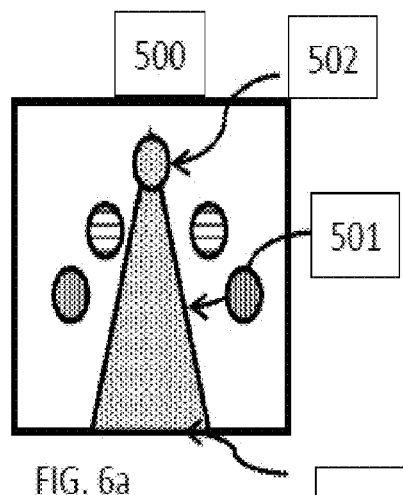
FIG. 6a
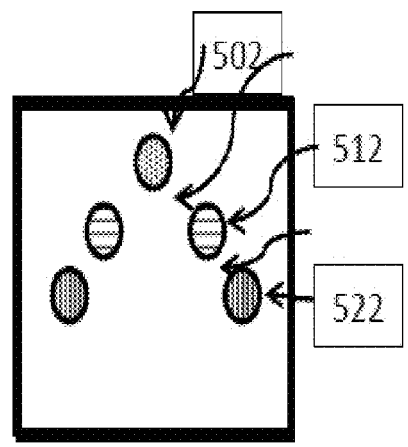
FIGS. 6d, 6e, 6f
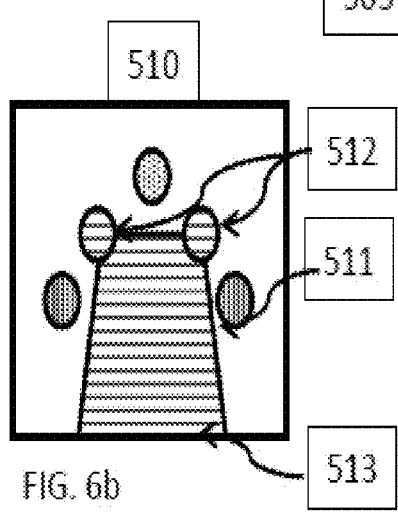
FIG. 6b
FIG. 6g
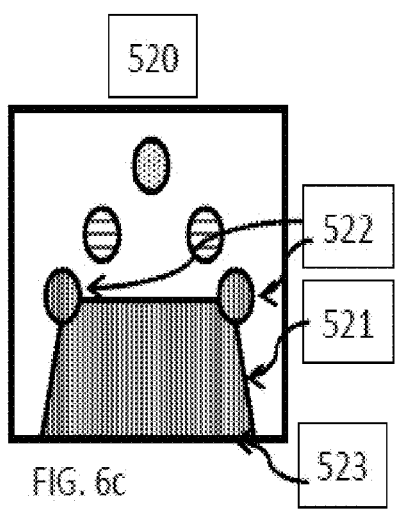
FIG. 6c
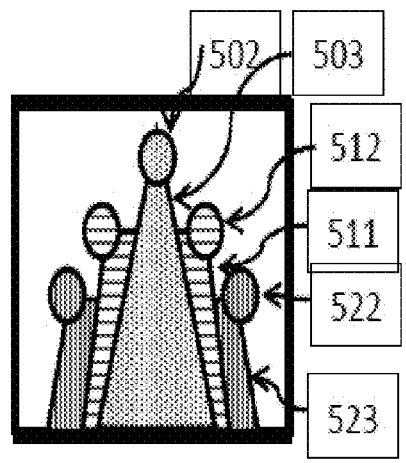
FIG. 6h

FIG. 8
Figure 8 Multiple nozzles on a single plate
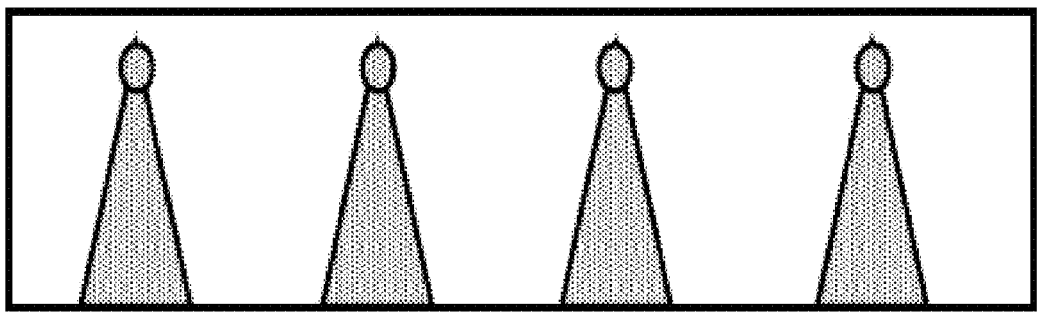
Figure 8a Carrier + Organic
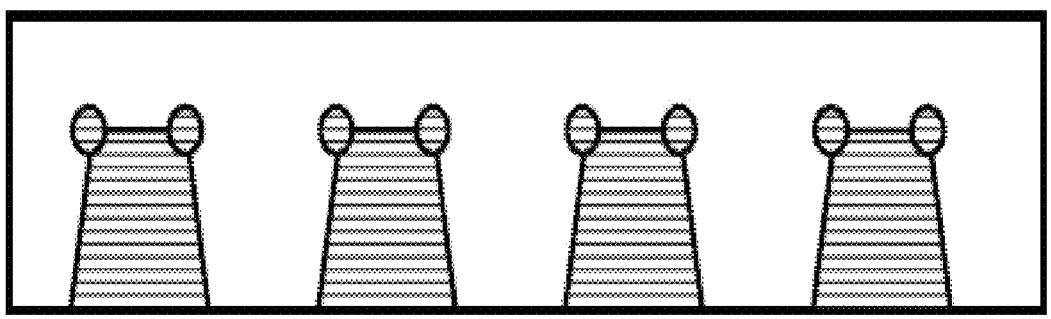
Figure 8b Vacuum
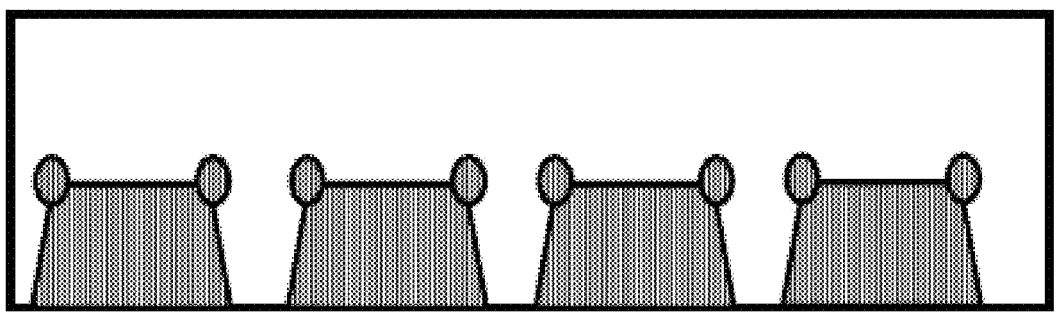
Figure 8c Purge

MICRO-NOZZLE AND MICRO-NOZZLE ARRAY FOR OVJP AND METHOD OF MANUFACTURING THE SAME

CROSS-REFERENCE TO RELATED APPLICATIONS

This application claims the benefit of U.S. Provisional Application No. 62/052,542, filed Sep. 19, 2014, and is related to U.S. application Ser. No. 14/643,887, filed on Mar. 10, 2015, the entire contents of which are incorporated herein by reference.

PARTIES TO A JOINT RESEARCH AGREEMENT

The claimed invention was made by, on behalf of and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to nozzles, nozzle arrays, and method of manufacturing a nozzle array using sheets of material to fabricate gas pathways and to separate each pathway with a separator sheet. The nozzles and nozzle arrays may be used to form devices such as organic light emitting diodes and other devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device, OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

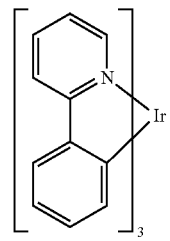

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices, "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

An embodiment of the disclosed subject matter provides a nozzle assembly including at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

An embodiment of the disclosed subject matter provides a method of manufacturing a nozzle assembly having at least one nozzle, the method including forming a first aperture along an edge of a first aperture plate to eject a carrier gas flow laden with condensable organic vapor onto a substrate in a deposition chamber, forming one or more second apertures on a second aperture plate disposed adjacent to the first aperture to form a vacuum aperture, where the first aperture plate and the second aperture plate are separated by a first separator plate, forming one or more third apertures on a third aperture plate to eject purge gas that are disposed adjacent to the second aperture plate, where the second aperture plate and the third aperture plate are separated by second separator plate, and disposing a third separator plate adjacent to the one or more third aperture plates to form a gas channel in the one or more third aperture plates.

An embodiment of the disclosed subject matter provides an OLED device made by a nozzle assembly including at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

An embodiment of the disclosed subject matter provides a deposition system comprising an isolated chamber in which deposition is performed by using at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

An embodiment of the disclosed subject matter provides a method of fabricating a nozzle includes forming a first aperture along an edge of a first aperture plate to eject a carrier gas flow laden with condensable organic vapor onto a substrate in a deposition chamber, forming one or more second apertures on a second aperture plate disposed adjacent to the first aperture to form a vacuum aperture, where the first aperture plate and the second aperture plate are separated by a first separator plate, forming one or more third apertures on a third aperture plate to eject purge gas that are disposed adjacent to the second aperture plate, where the second aperture plate and the third aperture plate are separated by second separator plate, and disposing a third separator plate adjacent to the one or more third aperture plates to form a gas channel in the one or more third aperture plates.

An embodiment of the disclosed subject matter provides a nozzle assembly including at least one nozzle having a first delivery aperture formed along an edge of a first delivery aperture plate to eject a carrier gas flow laden with condensable organic vapor onto a substrate in a deposition chamber, the first delivery aperture plate having a first side and a second side, a first separator plate disposed on the first side of the first delivery aperture plate, and a second separator plate disposed on the second side of the first delivery aperture plate, a second delivery aperture formed along an edge of a second delivery aperture plate to eject a carrier gas flow laden with condensable organic vapor onto the substrate in the deposition chamber, where the second delivery aperture plate is disposed adjacent to the first separator plate on a side opposite to the first delivery aperture plate, and a third delivery aperture formed along an edge of a third delivery aperture plate to eject a carrier gas flow laden with condensable organic vapor onto the substrate in the deposition chamber, where the third delivery aperture plate is disposed adjacent to the second separator plate on a side opposite to the first delivery aperture plate.

An embodiment of the disclosed subject matter provides a nozzle assembly includes at least one nozzle having a first aperture formed along an edge of a first aperture plate to eject a carrier gas flow laden with condensable organic vapor onto a substrate in a deposition chamber, one or more second apertures each formed on second aperture plates disposed adjacent to and on opposite sides of the first aperture to form a vacuum aperture, where the first aperture plate and the second aperture plates are separated by first separator plates, and second separator plates disposed adjacent to the second aperture plates, on an opposite side from the first separator plates.

An embodiment of the disclosed subject matter provides a nozzle assembly including at least one nozzle having a first aperture formed along an edge of a first aperture plate to eject a carrier gas flow laden with condensable organic vapor onto a substrate in a deposition chamber, one or more second apertures each formed on second aperture plates disposed adjacent to and on opposite sides of the first aperture to form a vacuum aperture, where the first aperture plate and the second aperture plates are separated by first separator plates, second separator plates disposed adjacent to the second aperture plates, on an opposite side from the first separator plates, and one or more third apertures each formed on third aperture plates respectively disposed adjacent to each of the second separator plates, opposite the second aperture plates, where confinement flow gas is directed through the one or more third apertures from a source external to the deposition chamber.

An embodiment of the disclosed subject matter provides a nozzle assembly including at least one nozzle having a first aperture formed along an edge of a first aperture plate to eject a carrier gas flow laden with condensable organic vapor onto a substrate in a deposition chamber, one or more second apertures each formed on second aperture plates disposed adjacent to and on opposite sides of the first aperture to form a vacuum aperture, where the first aperture plate and the second aperture plates are separated by first separator plates, second separator plates disposed adjacent to the second aperture plates, on an opposite side from the first separator plates, and third separator plates respectively disposed adjacent to each of the second separator plates opposite the second aperture plates, where the third separator plates are configured to define a roof of a channel for confinement gas to flow.

According to an embodiment, a first device comprising a first organic tight emitting device is also provided. The first organic light emitting device can include an anode, a cathode, and an organic layer, disposed between the anode and the cathode. The organic layer can include a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates. The first device can be a consumer product, an organic tight-emitting device, and/or a lighting panel.

BRIEF DESCRIPTION OF THE DRAWINGS

FIG. 5b shows a cross sectional diagram of a deposition structure having straight exhaust channels according to an embodiment of the disclosed subject matter.

FIG. 6a shows a plate cut out to form a carrier gas and organic aperture of a nozzle array to deposit an emissive OLED material according to an embodiment of the disclosed subject matter.

FIG. 6b shows a plate cut out to form a vacuum aperture of a nozzle array to deposit an emissive OLED material according to an embodiment of the disclosed subject matter.

FIG. 6c shows a plate cut, to forth a purge gas aperture of a nozzle array to deposit an emissive OLED material according to an embodiment of the disclosed subject matter.

FIG. 6d shows a separator plate used between the carrier gas and vacuum plates of a nozzle array to deposit an emissive OLED material according to an embodiment of the disclosed subject matter.

FIG. 6e shows a separator plate used between the vacuum and purge plates of a nozzle array to deposit an emissive OLED material according to an embodiment of the disclosed subject matter.

FIG. 6f shows an end plate used to form the outer edge of the vacuum aperture and flow path at the gas input side of the nozzle array to deposit an emissive OLED material according to an embodiment of the disclosed subject matter.

FIG. 6g shows end plate used at the last nozzle assembly to block gas flow of the nozzle array to deposit an emissive OLED material according to an embodiment of the disclosed subject matter.

FIG. 6h shows an overlay of plates showing overlap of gas flow channels and nozzle apertures of the nozzle array to deposit an emissive OLED material according to an embodiment of the disclosed subject matter.

FIG. 8a shows a carrier and organic multi-aperture plate with four (4) apertures of a nozzle array to deposit an emissive OLED material according to an embodiment of the disclosed subject matter.

FIG. 8b shows a vacuum multi-aperture plate of a nozzle array to deposit emissive OLED material according to an embodiment of the disclosed subject matter.

FIG. 8c shows a corresponding purge gas multi-aperture plate of a nozzle array to deposit an emissive OLED material according to an embodiment of the disclosed subject matter.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
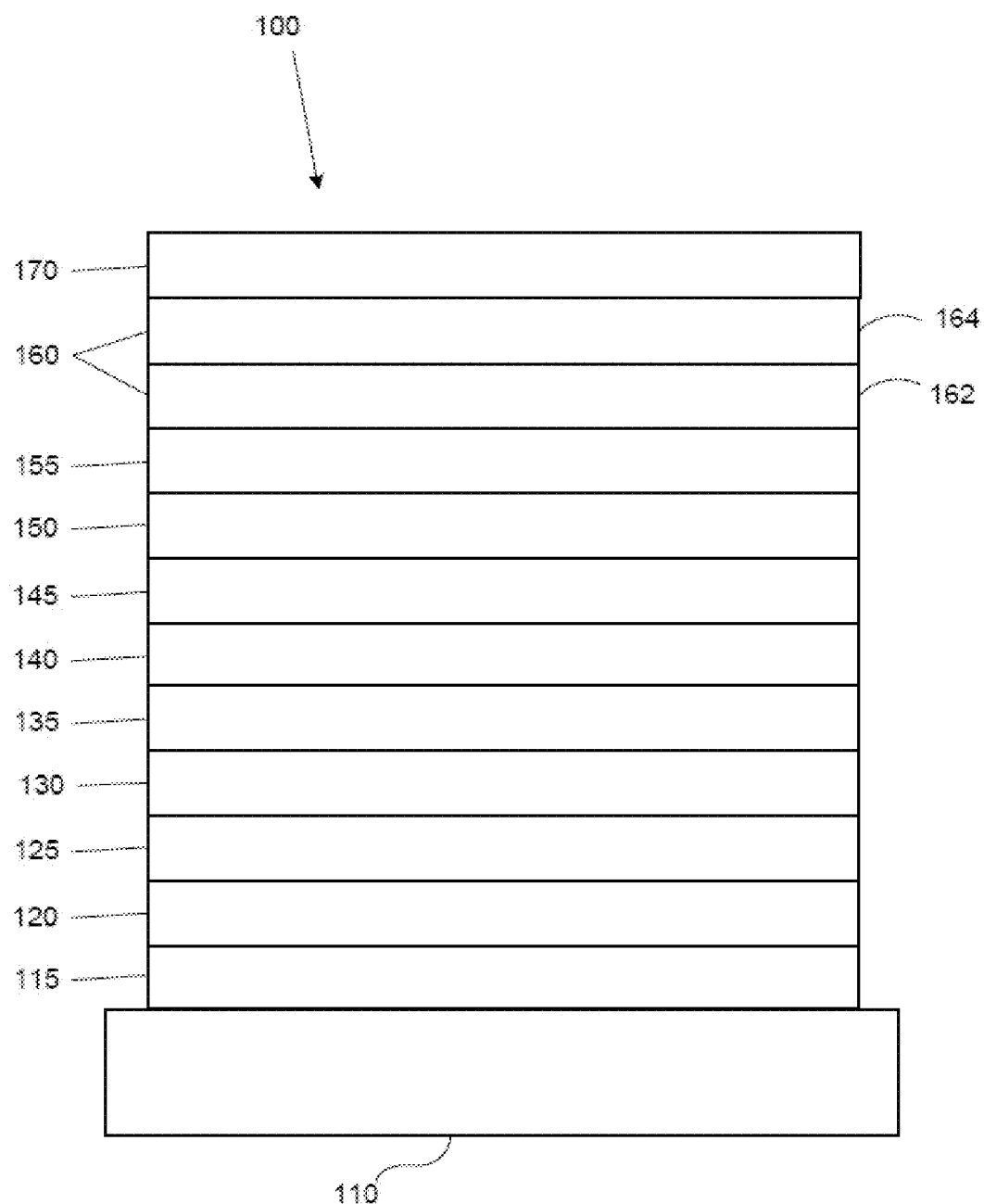
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
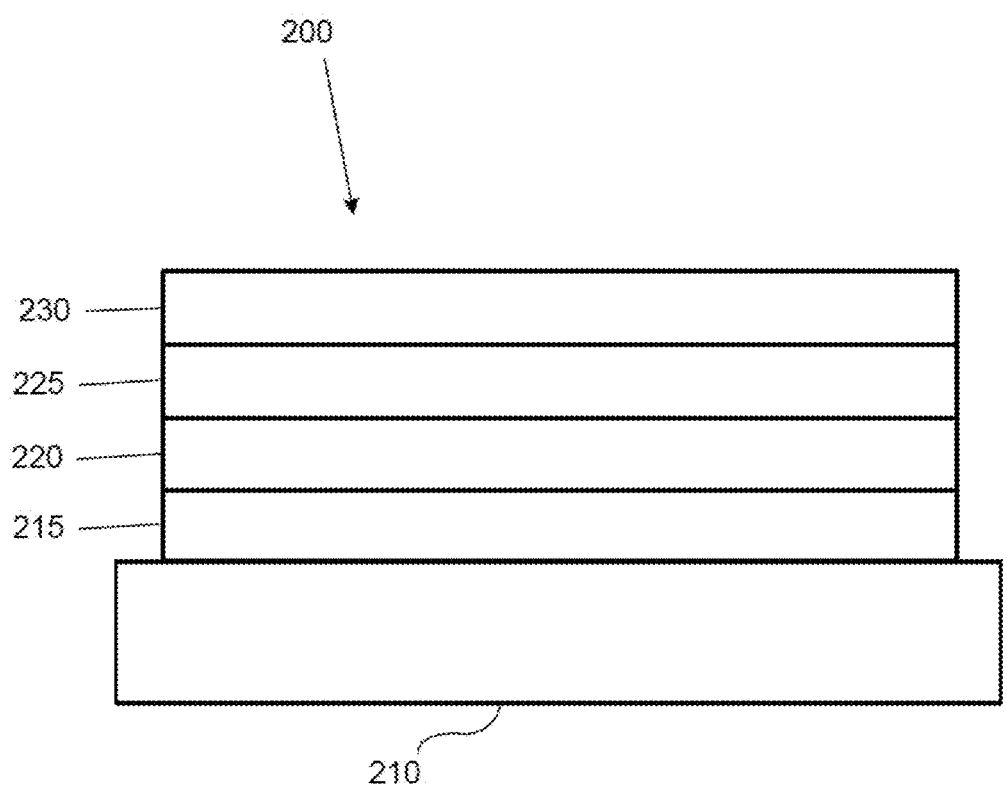
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may, be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Butovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as inkjet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and anon-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20°-25° C.), but could be used outside this temperature range, for example, from −40° C. to +80° C.

Figure 3:
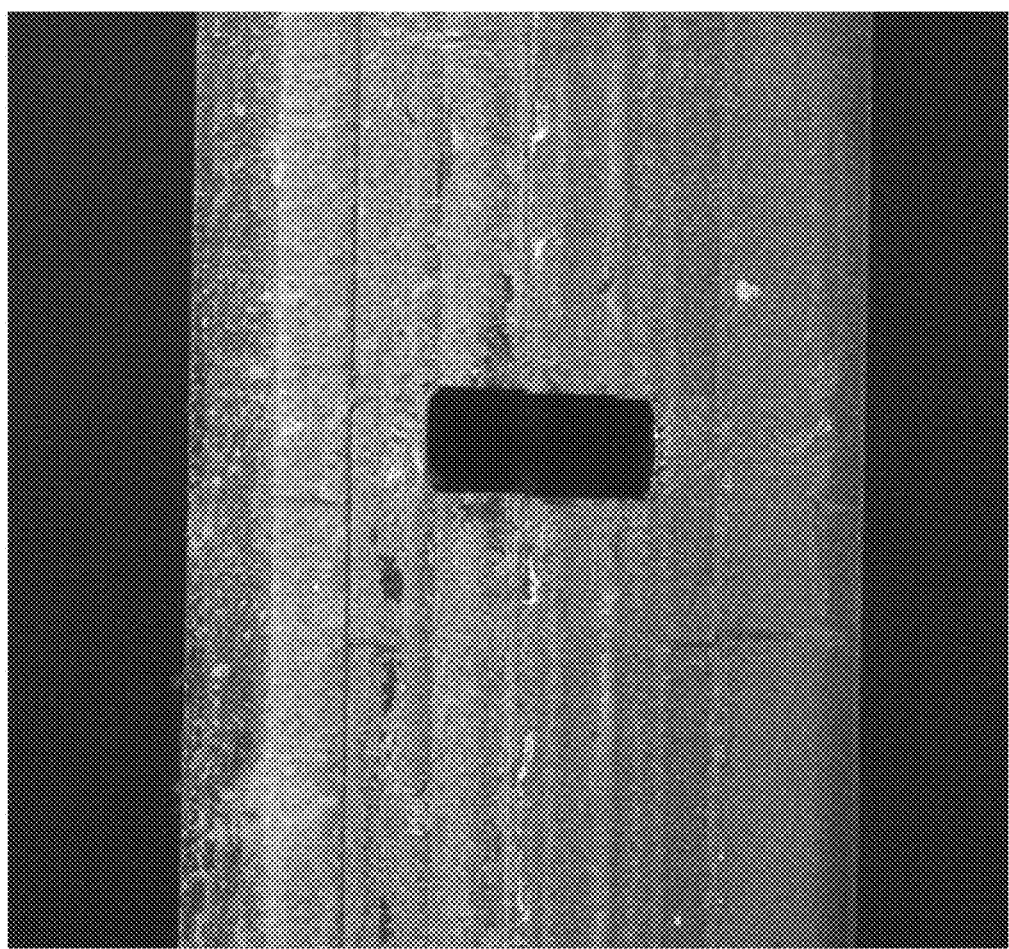
FIG. 3 shows a micro-machined nozzle formed using silicon fabrication techniques and joining two silicon wafers to form a cavity.

As discussed above, OJVP may be used to deposit OLED materials on a display substrate, OVJP, vapor jets are formed by flowing organic material in a carrier gas through a nozzle or series of nozzles. As used herein, "nozzle" refers to a structure which assists in managing the fluid flow of materials in deposition methods contemplated by the present disclosure. In various embodiments, a nozzle comprises one or more apertures from which materials are ejected. As will be understood based on the present disclosure, the shape, size, and functionality of a nozzle, among other properties, can be manipulated to affect deposition according to the various embodiments encompassed by the present disclosure. The size and shape of the nozzle typically determines the size and thickness uniformity profile of the deposited material. Pixel width in current generation OLED displays is typically less than 100 µm, and OVJP nozzles generally are designed to produce these narrow line widths. Nozzles and nozzle arrays are typically manufactured using silicon wafers and silicon micromachining techniques to form cavities between pairs of wafers. The length of each micromachined silicon nozzle is limited to a portion of the thickness of the silicon wafers, which limits the area of the nozzle, and thus, the deposition rate. FIG. 3 shows an example of a micro-machined nozzle formed using silicon fabrication techniques and joining two silicon wafers to form a cavity.

Figure 4:
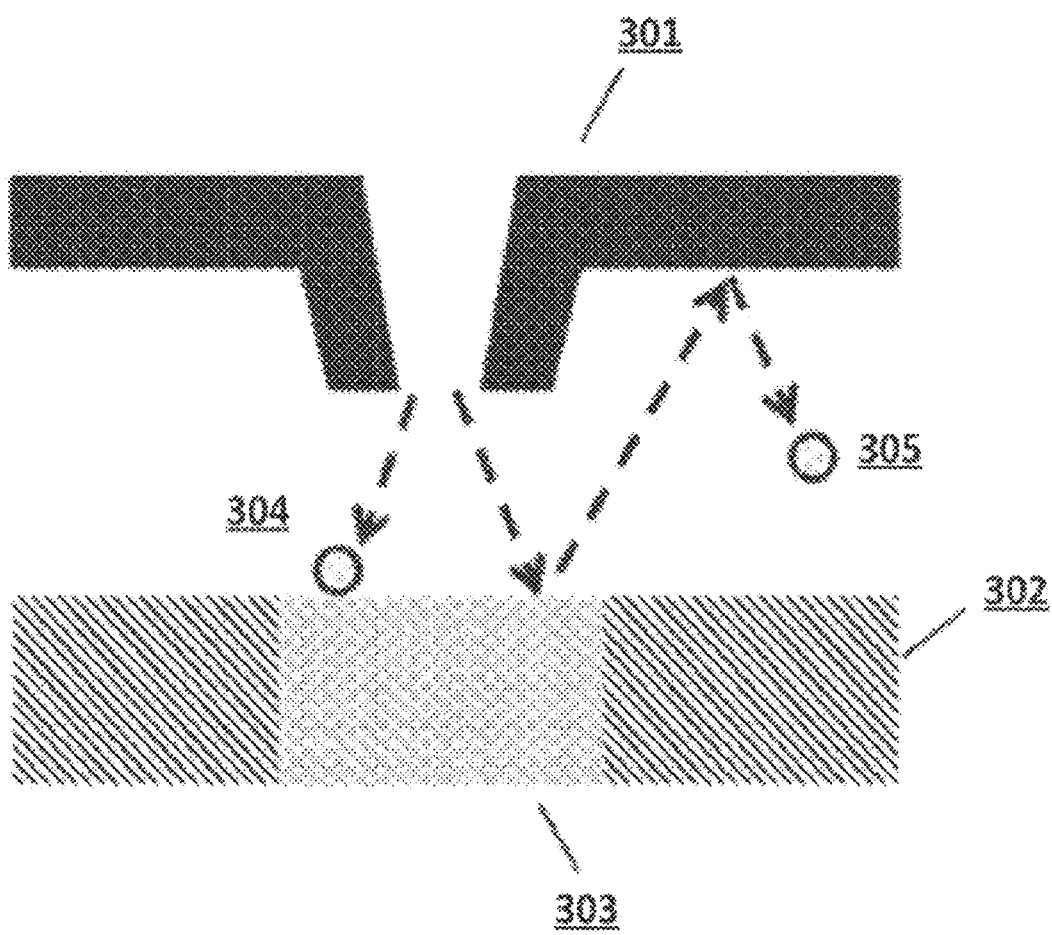
FIG. 4 shows a schematic representation of overspray in a conventional OVJP or similar system.

FIG. 4 shows a schematic representation of overspray in a conventional OVJP or similar system. Convective and diffusive broadening may be minimized by operating an OVJP process at a very low background pressure, for example, less than $10^{-4}$ Torr. However, overspray may persist due to non-unity a, (sticking coefficient) as shown in FIG. 4. Fine features may be printed with OVJP, for example, by placing a heated nozzle array 301 close to the substrate 302. Organic molecules that fail to adsorb on the substrate 302 may reflect back onto the underside of the nozzle array 301 and become scattered beyond the desired printing area 303. Organic molecules that initially adsorb (e.g., molecules 304) to the substrate 302 stay within the desired printing area 303, while molecules that do not adsorb (e.g., molecules 305) may be scattered further afield. The nozzle of the nozzle array 301 may be heated so that organic molecules (e.g., molecules 305) do not stick to its underside, and instead may be redirected onto the substrate 302 where they may land outside of the desired deposition area (e.g., desired printing area 303). Thus, it is desirable for material that does not adsorb to the substrate to be rapidly removed to minimize and/or prevent feature broadening, for example as discussed in detail in related to U.S. application Ser. No. 14/643,887, published as U.S. Pub. No. 2015/0376787, the disclosure of which is incorporated by reference in its entirety.

Figure 5A:
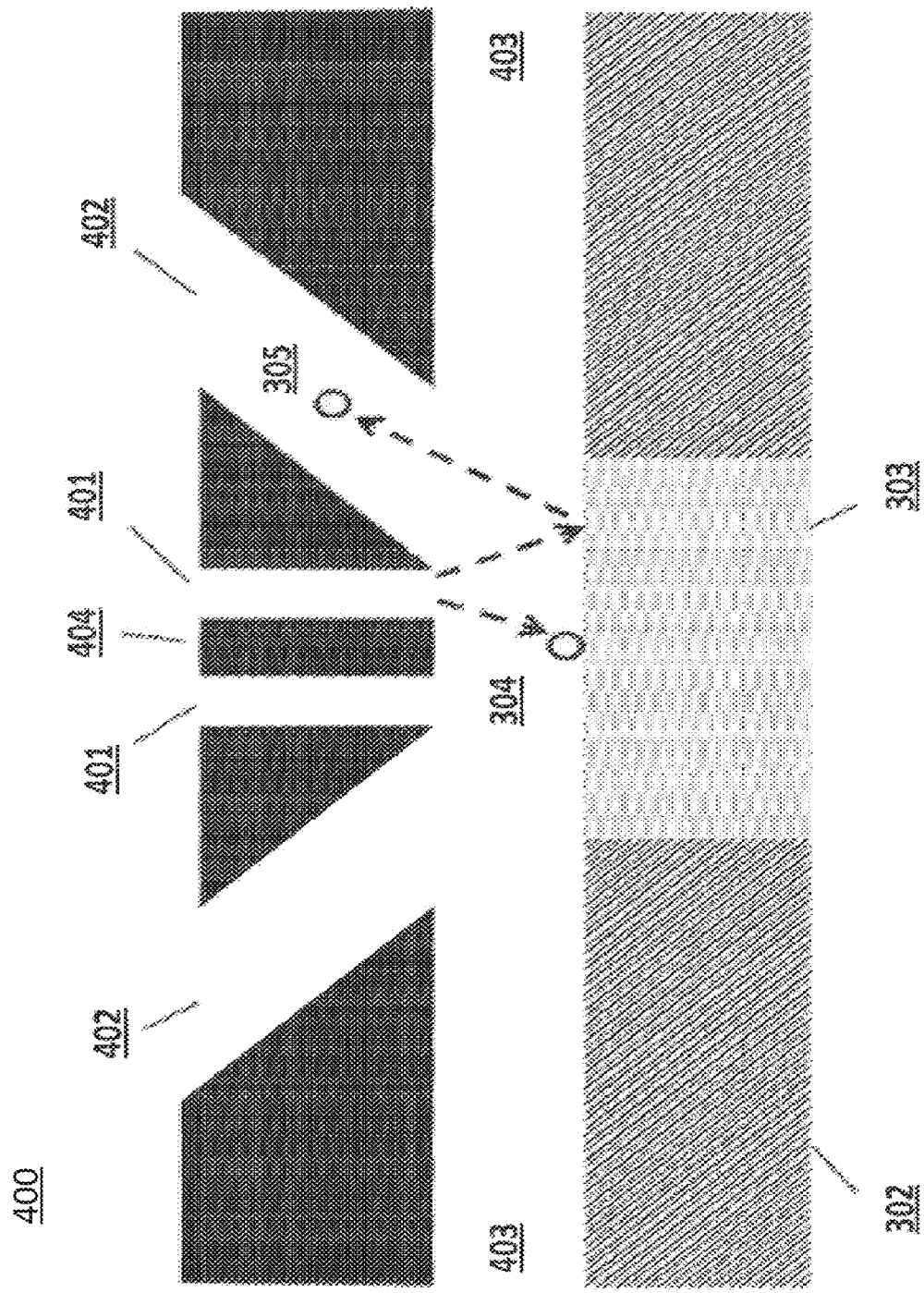
FIG. 5a shows a cross sectional diagram of a deposition structure having angled exhaust channels according to an embodiment of the disclosed subject matter.

FIGS. 5a-5b show a cross sectional diagrams of a deposition structure (e.g., nozzle assembly 400) according to embodiments disclosed herein. In particular, FIG. 5a shows a deposition structure having angled exhaust channels, and FIG. 5b shows a deposition structure having straight exhaust channels. A delivery channel 401 may be adjacent to, or surrounded by one or more exhaust channels 402. A delivery gas transporting a material to be deposited on a substrate 302 may be ejected from an aperture of the delivery channel 401 toward the substrate 302. Organic molecules that do not adsorb to the substrate (e.g., molecules 305) may be removed through the exhaust channel 402. A confinement gas 403 may be provided in a direction opposing the flow of material ejected from the aperture of the delivery channel of the nozzle. The confinement gas 403 may be provided from a source, such as a nozzle, an ambient source, or the like, from a location below the nozzle (i.e., between an aperture of the nozzle and the substrate 302) and adjacent to the nozzle and/or the exhaust channel 402. In some configurations, the confinement gas may be provided via a nozzle that is integrated with or integrally part of the nozzle block. Such a nozzle may be used even where the confinement gas flow is provided from the ambient environment. For example, a nozzle block may include one or more channels etched into the bottom of the nozzle block, through which the confinement gas 403 may be directed. One or more external nozzles (i.e., that are not integral with the nozzle block) may be used to direct the confinement gas into the deposition region. The confinement gas provided to the region between the nozzle assembly shown in FIGS. 5a-5b and the substrate 302 may be chilled, such that it has an average temperature lower than the ambient temperature of a chamber in which the deposition is performed. It also may be provided at ambient temperature, or at a temperature higher than ambient.

The confinement gas may flow inward from the outside of the deposition zone and guide surplus material into the exhaust channels 402. The confinement gas flow may oppose the flow of material ejected from the nozzle if the majority of the confinement gas flow is primarily in a direction anti-parallel to a direction in which the majority of the material ejected from the nozzle flows. Flow out of the nozzle (e.g., the delivery channel 401) in the deposition zone may be primarily defined by the gap between the nozzle array 301 and the substrate 302, rather than by the geometry of the nozzle itself. A confinement gas flow in the plane of the substrate 302 can therefore be considered to oppose a nozzle flow (e.g., a flow from an aperture of the delivery channel 401), regardless of the orientation of the nozzle. For example, if the nozzle (e.g., an aperture of the delivery channel 401 is oriented to eject material in a direction perpendicular to the plane of the substrate 302, material ejected from the nozzle is redirected by the substrate 302 so that it travels in the plane of the substrate 302. Ejected material is then redirected out of the plane of the substrate 302 further downstream from the nozzle (e.g., the aperture of the delivery channel 401) where it intersects a confinement gas flow moving in the opposite direction. The stream of confinement gas can originate either from the chamber ambient or from dedicated nozzles connected to an external gas source.

The exhaust channel 402 may be connected to a vacuum source, i.e., a source of pressure lower than that of the region between the nozzle (e.g., an aperture of the delivery channel 401) and the substrate 302. The vacuum source may be external to the deposition structure (e.g., the nozzle assembly 400). For example, the nozzle block or other deposition mechanism may include a connector configured to connect the exhaust channel 402 to an external vacuum source. As shown in FIG. 5a, the exhaust channel 402 may be angled, relative to the delivery channel 401, to allow sufficient material between the exhaust channel 402 and the delivery channel 401 within the nozzle block. This configuration may provide sufficient material in the nozzle block between the channels (e.g., the delivery channel 401 and the exhaust channel 402) for the nozzle block to be structurally sound. The exhaust channel 402 within the nozzle block may be angled relative to the delivery channel 401. Such a configuration may improve the uniformity of the deposited material on the substrate.

Compared to a "straight" exhaust channel passage with an axis of flow normal to the substrate, as shown in FIG. 5b, an angled passage as shown in FIG. 5a may minimize and/or prevent formation of sharp angle through which the confinement gas, delivery gas, and/or undeposited material would have to flow, as shown in further detail in the examples and simulations disclosed herein. The straight exhaust channel passages of the deposition structure may be formed using plates, as shown in FIGS. 6-12 and disclosed below.

The exhaust channel 402 may surround the nozzle passage (e.g., the delivery channel 401) within the nozzle block (e.g., the nozzle assembly 400). For example, the exhaust channel 402 may be of sufficient width within the nozzle block (e.g., the nozzle assembly 400) such that the smallest distance between the delivery channel 401 and the exhaust channel 402 is the same in at least two directions relative to the nozzle. In some configurations, the nozzle aperture may be defined by the planar edge of the nozzle block and a channel within the nozzle block. That is, a nozzle as disclosed herein may not require an additional tapered and/or other extended physical portion that extends beyond a lower surface of the nozzle block.

The nozzle aperture (e.g., delivery channel 401) can be bifurcated or otherwise divided by delivery channel separator 404 to include multiple apertures (e.g., multiple delivery channels 401, as shown in FIGS. 5a-5b). The delivery channel 401 that is divided by the delivery channel separator 404 may improve the uniformity of organic material flux onto the substrate 302 within the deposition zone. For example, without bifurcation (e.g., without the presence of the delivery channel separator 404), a raised or rounded deposition profile may result. In contrast, when the nozzle is bifurcated (e.g., the delivery channel 401 is divided by the delivery channel separator 404), the blocking material in the center of the nozzle may prevent material from depositing in the middle of the deposition area, leading to a flatter "plateau" type deposition profile. More generally, a nozzle as disclosed herein may include multiple apertures.

Nozzles as disclosed herein may be oriented vertically, i.e., positioned such that the axis of the delivery channel is perpendicular to a substrate on which material ejected by the nozzle is to be deposited. Alternatively or in addition, one or more nozzles may be positioned at an angle relative to the substrate, such as an angle between 0° and 90°.

A nozzle block as disclosed herein may include multiple delivery apertures and/or multiple exhaust channels, which may be disposed in any suitable arrangement within the nozzle block. For example, multiple delivery apertures may be disposed within a nozzle block, with exhaust channels disposed between adjacent nozzles. When multiple nozzles are used within a single nozzle block, they may be disposed in any suitable arrangement, such as a linear, staggered, or layered arrangement. Each arrangement of nozzles may be used to perform different ordered or simultaneous deposition. For example, in a linear arrangement, each nozzle may deposit a different layer over a single substrate that is moved past each nozzle in the linear arrangement in turn.

To increase the deposition rate of a nozzle assembly, one can increase the flow of carrier gas saturated with organic vapor can be increased, increase the amount of organic in the carrier gas by increasing the evaporator temperature, and/or increase the area of one or more nozzles. Increasing the flow rate may impact the shape of the deposition, potentially increasing the deposition width and limiting printing resolution. Increasing the evaporator temperature to increase carrier saturation may cause thermal degradation to the organic molecules. Increasing the area of the nozzle can only be done in one dimension as not to affect the printing width, and this dimension is limited to the silicon (Si) wafer thickness in micro-machined silicon devices. Related application U.S. application Ser. No. 14/643,887, incorporated by reference herein, discloses a fabrication process using MEMS techniques and silicon wafers.

Related application U.S. application Ser. No. 14/643,887 discloses reducing and/or eliminating overspray of printed lines caused by recoil of material from the substrate and subsequent re-deposition on areas adjacent to the intended deposition area. The technique uses a micro-machined nozzle having three zones, a deposition aperture to deliver carrier gas and organic vapor, a pair of exhaust apertures surrounding the deposition aperture, and a source of purge gas surrounding the vacuum aperture. The purge gas can be supplied through a separate set of apertures, or from the gas in the ambient of the deposition chamber. In various embodiments, the dimensions of the nozzle assembly are approximately 10 μm to 300 μm, and the nozzle assemblies may be fabricated using micro-machining techniques and silicon wafers. The cavities that form the apertures are etched as two mirror images into the surface of silicon wafers, and the wafers are subsequently bonded together forming the gas paths and apertures. The apertures formed by bonding wafers together are rectangular in shape, with the short axis in the plane of the wafer surface defining the printed line width, and the long axis perpendicular to the wafer surface. The long axis length is limited by the thickness of the silicon wafers used in the process. The vacuum cavity etch is deeper than the source cavity, roughly twice as deep. The typical wafer thickness is approximately 500 μm, which may limit the total length of the aperture to less than the thickness of the wafer (e.g., half of the wafer thickness may be used for the outer wall of the cavity), typically about 250 μm to 300 μm in length.

As an alternative to silicon wafer based micro-machining style processing, embodiments of the disclosed subject matter are directed to stacking pre-formed thin sheets to tort nozzle arrays of narrow width (comparable to silicon nozzles), and large lengths, more than 100 times larger than is achievable using fabrication in silicon (Si) wafers. Example dimensions for the pre-formed thin sheets are provided below in connection with one or more embodiments.

Deposition rate from a nozzle may be determined by the volume of organic material that is delivered per unit area of nozzle aperture. The TAKT time of a fabrication system generally measures the average production time needed to meet demand, and often scales as an inverse linear function of deposition rate. Thus, higher deposition rates may be desirable. To increase the deposition rate, the amount of material delivered is increased. For example, this may be done by forcing more material through the same size nozzle, adding more nozzles, or increasing the size of the nozzle. Embodiments of the disclosed subject matter provide flow channel nozzle designs with increased nozzle aperture areas, straight forward multiplexing, and simplified manufacturing methods.

Each nozzle in the embodiments of the disclosed subject matter may include three gas flow paths. One path may be for carrier gas and organic vapor, one path may be for exhaust, and one path may be for purge gas. Carrier gas and organic vapor may be supplied from a sublimation source held at elevated temperature, which may be a temperature high enough to evaporate or sublimate organic material. The carrier gas may flow through the sublimation source and may become saturated with organic vapor. The concentration of organic vapor in the carrier gas may be a function of the pressure and temperature in the sublimator (i.e., sublimation source). The vacuum path may be connected to an external vacuum source which is maintained at a pressure lower than the chamber ambient pressure and the purge gas pressure. Apertures for the vacuum path may surround the aperture of the carrier gas on at least the two long sides of the rectangular carrier gas aperture. Purge gas may be supplied by an additional pair of apertures located adjacent to the vacuum apertures, or can be supplied from the chamber ambient (i.e., a region of space around the substrate, nozzle assembly, and/or deposition system).

The embodiments of the disclosed subject matter differ from that of the micro-machined silicon wafer fabrication method disclosed in related application U.S. application Ser. No. 14/643,887 in the design of the array, method of making the nozzle array, and the size of the apertures. The embodiments of the disclosed subject matter use thin solid sheets of material to fabricate each of the gas pathways, and separates each pathway with a separator sheet. The solid sheets can be made of metal foils or plates, thin glass or ceramic sheets or polymer films and sheets. Sheets of different materials may be combined to make a nozzle array.

In the embodiments of the disclosed subject matter discussed below, dimensions given in the various examples are illustrative only. That is, various ranges (e.g., +/−20%) around the specific examples given may be used, and/or any other suitable dimensions may be used in other embodiments.

FIGS. 6a-6h show examples of a nozzle array according to embodiments of the disclosed subject matter. In the example of FIGS. 6a-6h, the nozzle array deposits an emissive OLED material for a device such as a 55 inch UHD (ultra-high definition) display with a 316 μm pixel pitch. FIG. 6a shows a plate cut out to form a carrier gas and an organic aperture. FIG. 6b shows a plate cut out to form a vacuum aperture. FIG. 6c shows a plate cut to form a purge gas aperture.

FIGS. 6d-6f show separator plates having the same configuration according to embodiments of the disclosed subject matter. That is, each of the separator plates have gas distribution channels supplying gas or vacuum to the carrier, vacuum, and purge plates, where each plate is disposed in a different location. In particular, FIG. 6*d* shows a separator plate used between the carrier gas and vacuum plates. FIG. 6*e* shows a separator plate used between the vacuum and purge plates, and FIG. 6*f* shows an end plate used to form the outer edge of the vacuum aperture and flow path at the gas input side of the nozzle array. The separator plates use the same pattern of gas and vacuum distribution channels 502, 512 and 522, but differ in thickness of the plates.

FIG. 6*g* shows the end plate used at the last nozzle assembly to block gas flow. FIG. 6*h* shows an overlay of plates, where there is an overlap of gas flow channels and nozzle apertures. As shown in FIGS. 6*a*-6*h*, each of the plates has five holes that form the gas distribution channels between plates.

FIG. 6*a* shows a carrier gas plate 500, along with the organic aperture (i.e., aperture 503) and a gas distribution pathway (i.e., a carrier gas flow channel 501) which distributes gas to each nozzle and between nozzle plates 502, the carrier gas flow channel 501, and the aperture 503. Not shown is the thickness of the carrier gas plate 500, which may be 13 µm. FIG. 6*b* shows the vacuum plate 510 with vacuum distribution channels 512, vacuum flow channel 511 and vacuum aperture 513. FIG. 6*c* shows the purge gas plate 520 with gas distribution channels 522, purge gas flow channel 521 and purge gas aperture 513.

Figure 9:
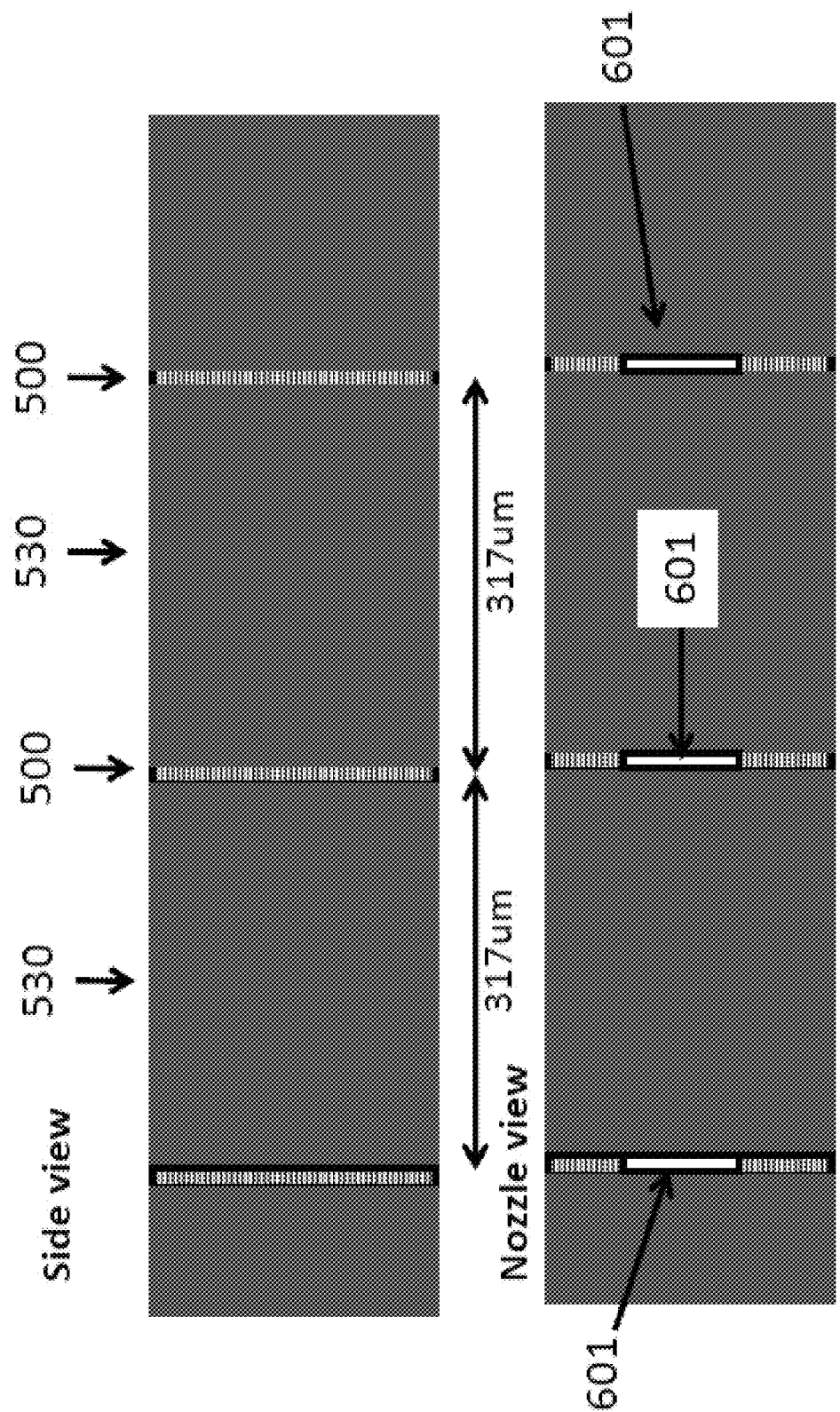
FIG. 9 shows an example nozzle configuration having stacked delivery aperture plates and separators to form a structure to direct carrier gas to a desired area on a substrate according to an embodiment of the disclosed subject matter.

FIGS. 6*d*, 6*e*, and 6*f* show the side view of separator plates (e.g. separator plates 530 as shown in FIG. 9 and described below), illustrating the gas distribution channels supplying gas (e.g., gas distribution channel 522) or vacuum (e.g., vacuum distribution channel 512) to the carrier, vacuum and purge plates (e.g., carrier gas plate 500, vacuum plate 510, and purge gas plate 520, respectively). FIG. 6*g* shows the end plate placed at the termination of a nozzle assembly to seal the flow channels. FIG. 6*h* shows an overlay end view of the plates (e.g. as shown in FIGS. 6*a*-6*f*) to show the relationship of flow channels and flow paths. That is, FIG. 6*h* shows the relationship between the carrier gas plate 500, vacuum plate 510, and purge gas plate 520 by showing the positional relationship between the nozzle plate 502, the aperture 503, the vacuum distribution channel 512, the vacuum flow channel 511, the gas distribution channel 522, and the purge gas aperture 523.

Figure 7:
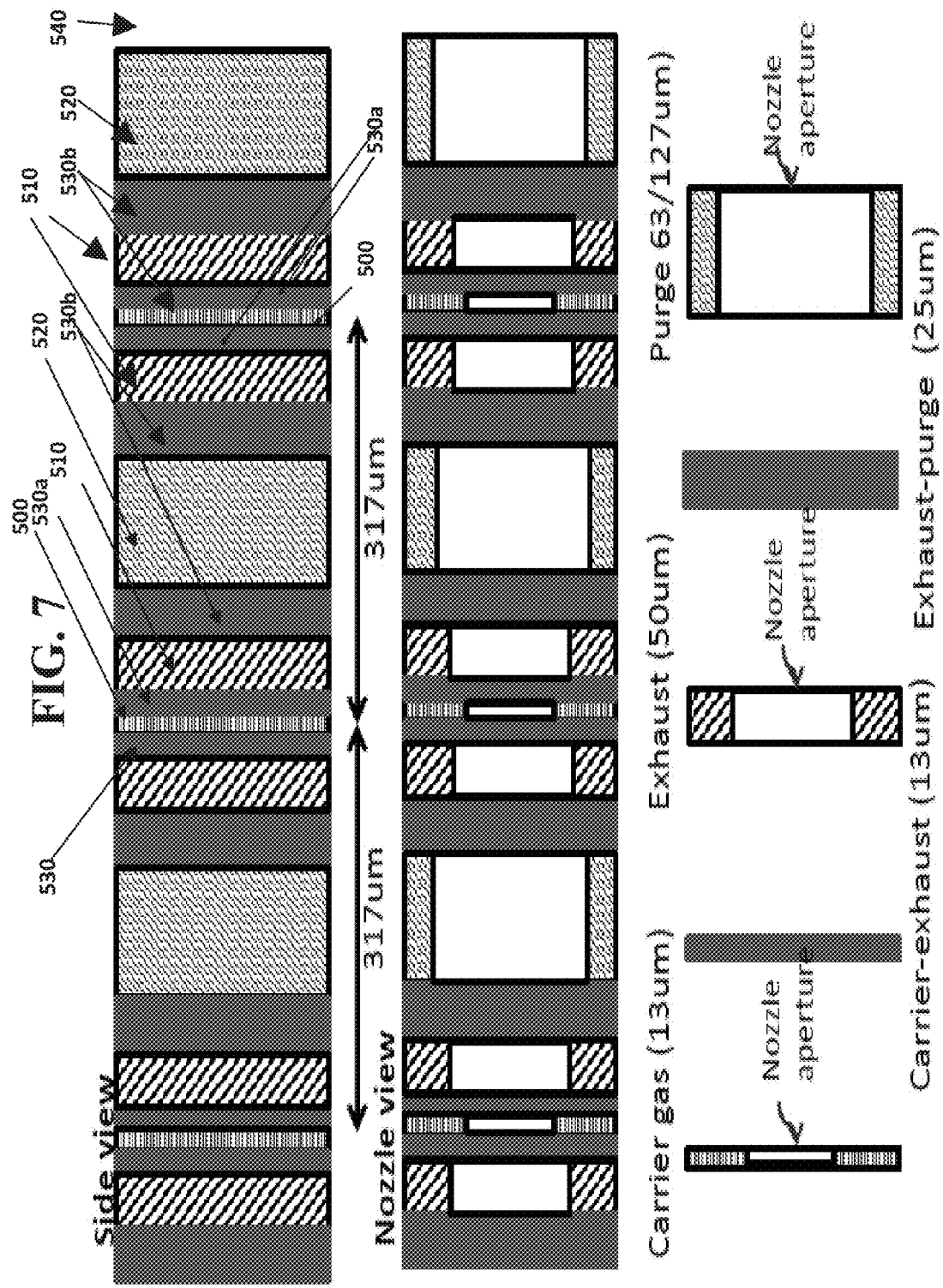
FIG. 7 shows a nozzle formed by stacking a number of aperture plates and separators to form a structure to direct carrier gas to the desired area on a substrate material according to an embodiment of the disclosed subject matter.

An embodiment of the disclosed subject matter, as shown in FIG. 7, provides a nozzle assembly including at least one nozzle having a first aperture formed along an edge of a first aperture plate to eject a carrier gas flow laden with condensable organic vapor onto a substrate in a deposition chamber. One or more second apertures may be formed on a second aperture plate disposed adjacent to the first aperture to form a vacuum aperture, where the first aperture plate and the second aperture plate are separated by a first separator plate. One or more third apertures may be formed on a third aperture plate to eject purge gas that are disposed adjacent to the second aperture plate, where the second aperture plate and the third aperture plate are separated by second separator plate. A third separator plate may be disposed adjacent to the one or more third aperture plates to form a gas channel in the one or more third aperture plates.

As shown in FIG. 7, a nozzle may made by stacking a number of aperture plates and separators to form a structure to direct carrier gas to the desired area on a substrate. The carrier gas aperture plate 500 is at the center of each nozzle, and is surrounded on both sides by 13 µm thick separator plates 530*a*. Continuing outward from each of the separator plate 530*a* is a vacuum plate 510 and another, thicker separator plate 530*b* (25 µm thick), followed by a purge gas plate 520. For a single nozzle, the vacuum plates 510 may be capped with separator plates 530*a*, 530*b*. One side may be blank to contain gas and vacuum in the distribution channels and the other side may have a separator plate connected to gas and vacuum sources. That is, the first, second, and third aperture plates of the embodiment disclosed in FIG. 7 may be selected from the group including carrier gas aperture plates, vacuum plates, and purge gas plates.

As shown in FIG. 7, starting from the supply end (i.e., the right side, as shown in FIG. 7) of the nozzle the order of plates is:
1. Gas supply separator end plate (540)
2. Purge gas plate (520)
3. Separator plate (25 µm) (530*b*)
4. Vacuum plate (510)
5. Separator plate (13 µm) (530*a*)
6. Carrier gas+organic plate (500)
7. Separator plate (13 µm) (530*a*)
8. Vacuum plate (510)
9. Separator plate (25 µm) (530*b*)
10. Purge gas plate (520)
11. End plate (100 µm) (not shown in FIG. 7, as the nozzle structure repeats, but would be present in a non-repeating structure)

The stacked plates may be clamped in a fixture which contains the gas and vacuum supply on one side and blank plate on the opposite side. Gas and vacuum supplies can be sealed to the attacked plate assembly with a flat gasket or with O-rings inset into the end plate.

Multiple nozzles may be stacked together to make a nozzle array to print, for example, two (2) lines to more than 100 lines simultaneously by repeating the stacking sequence, and omitting the end plate. Purge gas plates 520 may be shared between neighboring nozzles, shortening the distance between printed lines, as shown in FIG. 7.

In some embodiments of the disclosed subject matter, the nozzle assembly can include a gap disposed between a stacked formation of the first, second, and third aperture plates and the substrate that direct the purge gas flow anti-parallel to the carrier gas flow, and into one or more exhaust apertures that are in communication with a vacuum source external to the deposition chamber.

A nozzle designed to comprise a single deposition aperture may be formed by placing sheets of material formed to have the first, second, and third apertures along one edge and gas channels through the assembly. That is, a single deposition aperture nozzle assembly may comprise one or more apertures in addition to the deposition aperture. The nozzle for the single deposition assembly may be formed by alternating aperture sheets having the first, second, and third apertures with separator sheets to form gas flow paths from the gas channels to at least one of the first, second, and third apertures.

The nozzle assembly may have at least one nozzle for multiple deposition apertures, which may be formed by repeating placement of sheets of material formed to have apertures along one edge and gas channels through the assembly so that multiple deposition nozzles are formed, separated by a number of sheets. A multiple deposition aperture nozzle assembly may include a plurality of nozzles, with each nozzle comprising one or more apertures. For example, the number of nozzles may be between 10 and 100. In another example, the number of nozzles may be greater than 100.

In embodiments of the disclosed subject matter, such as the embodiment shown in FIG. 7, at least one nozzle of the nozzle assembly may include an aperture plate, where each plate contains more than one aperture to deposit a single line.

At least one nozzle of the nozzle assembly may be a single deposition nozzle assembly that is formed by placing sheets of material formed to have multiple apertures along one edge and gas channels through the assembly. The single deposition nozzle assembly formed by alternating multi-aperture sheets and separator sheets to form gas flow paths from the gas channels to the respective aperture. In some embodiments, the single deposition nozzle may be formed by placing multi-aperture plates, with the respective plates having the first aperture, the one or more second apertures, the one or more third apertures, and the separator plates disposed between the respective plates, to form the at least one nozzle. The single deposition nozzle assembly may be formed by stacking more than one multi-aperture nozzle assembly to form a two-dimensional nozzle assembly.

The nozzle assembly, such as the embodiment shown in FIG. 7, may include a heater to heat the at least one nozzle to a temperature greater than that of the evaporation temperature of a least volatile organic species in the carrier gas. The nozzle assembly may include a chiller plate oriented parallel to the substrate that surrounds the at least one nozzle.

In an embodiment of the disclosed subject matter, the vacuum source may be at a lower pressure than the deposition chamber ambient pressure. The purge gas of the nozzle assembly may have the same average molar mass as the carrier gas. In some embodiments, the purge gas may have a greater average molar mass than the carrier gas. An ambient gas of the deposition chamber may have the same molecular weight as the purge gas. In some embodiments, an ambient gas of the deposition chamber has lower molecular weight than the purge gas. The deposition chamber may have an ambient pressure of at least 10 Torr. In some embodiments, the deposition chamber ambient pressure may be at least 100 Torr. In some embodiments of the disclosed subject matter, the deposition chamber ambient pressure may be at least 760 Torr.

Embodiments of the disclosed subject matter provide a method of manufacturing a nozzle assembly having at least one nozzle, such as shown in FIG. 7. The method may include forming a first aperture along an edge of a first aperture plate to eject a carrier gas flow laden with condensable organic vapor onto a substrate in a deposition chamber. The method may include forming one or more second apertures on a second aperture plate disposed adjacent to the first aperture to form a vacuum aperture, where the first aperture plate and the second aperture plate are separated by a first separator plate. The method may include forming one or more third apertures on a third aperture plate to eject purge gas that are disposed adjacent to the second aperture plate, where the second aperture plate and the third aperture plate are separated by second separator plate. The method may include forming a third separator plate adjacent to the one or more third aperture plates to form a gas channel in the one or more third aperture plates.

The method may include forming a gap between a stacked formation of the first, second, and third aperture plates and the substrate that direct the purge gas flow anti-parallel to the carrier gas flow, and into one or more exhaust apertures that are in communication with a vacuum source external to the deposition chamber.

In some embodiments of the disclosed subject matter, such as shown in FIG. 7, an OLED device may be made by a nozzle assembly including at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

The nozzle assembly that makes the OLED device may include a gap disposed between a stacked formation of the first, second, and third aperture plates and the substrate that direct the purge gas flow anti-parallel to the carrier gas flow, and into one or more exhaust apertures that are in communication with a vacuum source external to the deposition chamber.

In embodiments of the disclosed subject matter, such as shown in FIG. 7, a deposition system may include an isolated chamber in which deposition is performed by using at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

The at least one nozzle of the deposition system may include a gap disposed between a stacked formation of the first, second, and third aperture plates and the substrate that direct the purge gas flow anti-parallel to the carrier gas flow, and into one or more exhaust apertures that are in communication with a vacuum source external to the deposition chamber. The at least one nozzle of the deposition system may be rastered over a substrate disposed adjacent to the at least one nozzle to form a continuous film. In some embodiments, the substrate may be rastered adjacent to the at least one nozzle. The at least one nozzle of the deposition system may be rastered over a substrate disposed adjacent to the nozzle to form discrete areas of film. In some embodiments, the substrate may be rastered adjacent to the at least one nozzle.

The deposition rate can be increased by combining multiple gas channels in a plate that is longer than a single gas channel plate, as disclosed in the embodiments shown in FIGS. 8a-8c. These longer plates may be stacked in the same manner as single aperture plates to form nozzles and nozzle assemblies. FIG. 8a shows the carrier and organic multi-aperture plate with four (4) apertures, FIG. 8b shows the vacuum multi aperture plate and FIG. 8c shows the corresponding purge gas multi-aperture plate.

Multiple separate nozzle assemblies of the deposition system, such as shown in FIGS. 7-8, may be used simultaneously in a common chamber. The deposition system may include a plurality of chambers, where each chamber is used to deposit different organic materials. The deposition system may include an alignment system to register the deposition to fiducial marks on the substrate.

Embodiments of the disclosed subject matter may provide a method of fabricating a nozzle including forming a first aperture along an edge of a first aperture plate to eject a carrier gas flow laden with condensable organic vapor onto a substrate in a deposition chamber. The method may include forming one or more second apertures on a second aperture plate disposed adjacent to the first aperture to form a vacuum aperture, where the first aperture plate and the second aperture plate are separated by a first separator plate. The method may include forming one or more third apertures on a third aperture plate to eject purge gas that are disposed adjacent to the second aperture plate, where the second aperture plate and the third aperture plate are separated by second separator plate. The method may include disposing a third separator plate adjacent to the one or more third aperture plates to form a gas channel in the one or more third aperture plates.

The method may include forming a gap between a stacked formation of the first, second, and third aperture plates and the substrate that direct the purge gas flow anti-parallel to the carrier gas flow, and into one or more exhaust apertures that are in communication with a vacuum source external to the deposition chamber. In some embodiments, the method may include the plates are stacked to form a multi-aperture array, and where the plates are clamped in a fixture which provides gas and vacuum to the gas channels in the aperture plates and provides sufficient clamping force to seal the surfaces of the plates. The method may include where the plates are formed from at least one of metal, glass, ceramic material, silicon, and polymeric material.

EXPERIMENTAL

FIG. 7 shows an example nozzle formed by stacking a number of aperture plates and separators to form a structure according to an embodiment of the disclosed subject matter. Similarly, FIGS. 9-12 show different nozzle configurations that may be made by stacking a number of aperture plates and separators, having different thicknesses, to form a structure to direct carrier gas to the desired area on a substrate, as discussed in detail below.

An embodiment of the disclosed subject matter, as shown in FIG. 9, provides a nozzle assembly including at least one nozzle having a first delivery aperture formed along an edge of a first delivery aperture plate to eject a carrier gas flow laden with condensable organic vapor onto a substrate in a deposition chamber. The first delivery aperture plate has a first side and a second side, where a first separator plate is disposed on the first side of the first delivery aperture plate, and a second separator plate is disposed the second side of the first delivery aperture plate. A second delivery aperture is formed along an edge of a second delivery aperture plate to eject a carrier gas flow laden with condensable organic vapor onto the substrate in the deposition chamber. The second delivery aperture plate may be disposed adjacent to the first separator plate on a side opposite to the first delivery aperture plate. A third delivery aperture may be formed along an edge of a third delivery aperture plate to eject a carrier gas flow laden with condensable organic vapor onto the substrate in the deposition chamber. The third delivery aperture plate may be disposed adjacent to the second separator plate on a side opposite to the first delivery aperture plate.

That is, FIG. 9 shows an embodiments of a nozzle assembly having a delivery aperture only. A 13 μm thick carrier gas aperture plate 500 may be disposed at the center of each nozzle, and it may be surrounded on both sides by 304 μm thick separator plates 530. Another delivery plate (e.g., another carrier gas aperture plate 500) may be disposed on the opposite side of the separator plate. A nozzle array containing an arbitrary number of delivery apertures 601 each spaced 316 μm across can be constructed from alternating delivery plates 500 and separator plates 530.

An embodiment of the disclosed subject matter, as shown in FIG. 10, provides a nozzle assembly includes at least one nozzle having a first aperture formed along an edge of a first aperture plate to eject a carrier gas flow laden with condensable organic vapor onto a substrate in a deposition chamber. One or more second apertures are each formed on second aperture plates disposed adjacent to and on opposite sides of the first aperture to form a vacuum aperture. The first aperture plate and the second aperture plates may be separated by first separator plates, and second separator plates may be disposed adjacent to the second aperture plates, on an opposite side from the first separator plates.

That is, as shown in FIG. 10, a nozzle assembly containing delivery and exhaust apertures can be made (e.g., in carrier gas aperture plate 500 and vacuum plate 510, respectively). The delivery plate (e.g., carrier gas aperture plate 500) is surrounded by thin separator plates 530 having a 13 μm thickness. These separator plates separate the delivery channel from of 30 μm thick exhaust plates (e.g., vacuum plates 510) that are stacked on either side of the delivery plates (e.g., carrier as aperture plates 500). An additional, 218 μm thick separator plate 530 may separate each five plate assembly from its nearest neighbor, forming a repeating six plate unit 701. That is, six plate unit 701 includes, as shown from left to right in FIG. 10: a vacuum plate 510, a separator plate 530, a carrier gas aperture plate 500, a separator plate 530, a vacuum plate 510, and the additional 218 μm thick separator plate 530. Each of these units 710 may have a delivery aperture 601 (of the carrier gas aperture plate 500), and may be surrounded by two exhaust apertures 702 (of the vacuum plate 510) of the when viewed from the nozzle edge (i.e., the nozzle view shown in FIG. 10).

An embodiment of the disclosed subject matter, as shown in FIG. 11, provides a nozzle assembly including at least one nozzle having a first aperture formed along an edge of a first aperture plate to eject a carrier gas flow laden with condensable organic vapor onto a substrate in a deposition chamber. One or more second apertures may be formed on second aperture plates disposed adjacent to and on opposite sides of the first aperture to form a vacuum aperture. The first aperture plate and the second aperture plates may be separated by first separator plates. Second separator plates may be disposed adjacent to the second aperture plates, on an opposite side from the first separator plates. One or more third apertures may be formed on third aperture plates respectively disposed adjacent to each of the second separator plates, opposite the second aperture plates. Confinement flow gas may be directed through the one or more third apertures from a source external to the deposition chamber.

That is, FIG. 11 shows a confinement flow fed through apertures from a source external to the chamber. The 218 μm wide separator plate from the previous example (the thick separator plate 530 shown in FIG. 10) may be replaced by a 118 μm wide confinement plate 520 surrounded on each side by 50 µm separator plates 530. The addition of a confinement plate 520 and an additional separator plate 530 may form a new, eight plate repeating unit 801, which includes a single confinement aperture 802 positioned between the exhaust apertures of adjacent repeating units. That is, the eight plate unit 801 includes, as shown from left to right in FIG. 11: a carrier gas aperture plate 500, a separator plate 530, a vacuum plate 510, a separator plate 530, a confinement plate 520, a separator plate 530, a vacuum plate 510 and a separator plate 530.

Figure 11:
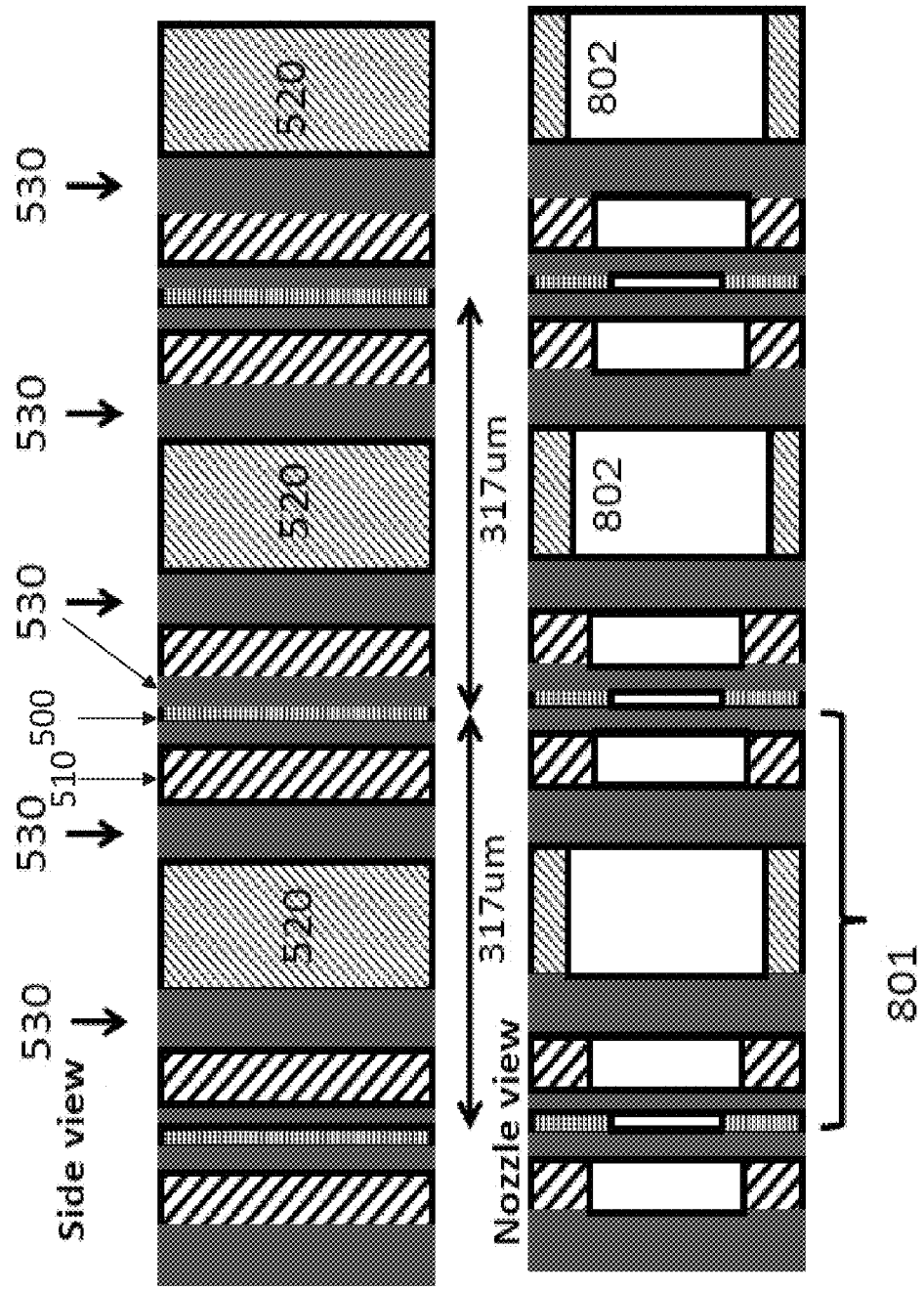
FIG. 11 shows the example nozzle configuration of FIG. 10 that includes confinement flow fed from through apertures from a source external to the chamber according to an embodiment of the disclosed subject matter.

Since there is only one confinement aperture per repeat unit in the FIG. 11 example (e.g., where the eight plate unit 801 is the repeat unit), it feeds confinement gas to two adjacent exhaust apertures that are each associated with different delivery apertures. This may reduce the size and complexity of the nozzle array. An additional separator plate and confinement plate can be added to each repeat unit (e.g., eight plate unit 801) so that each confinement aperture feeds a single aperture to reduce coupling between adjacent sets of delivery and exhaust apertures.

Figure 10:
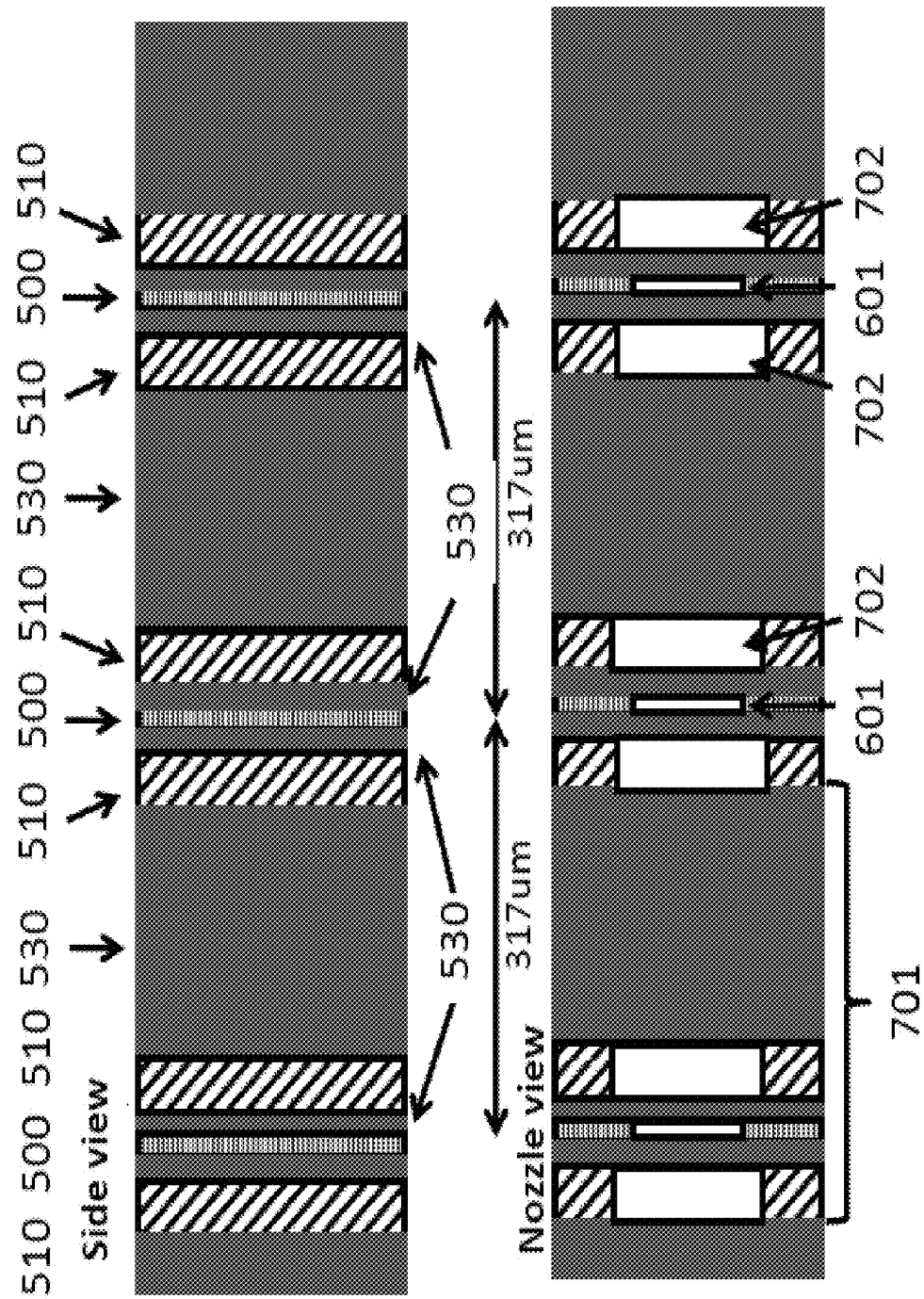
FIG. 10 shows an example nozzle configuration having stacked delivery and exhaust apertures, as well as separators, to form a structure to direct carrier gas to a desired area on a substrate according to an embodiment of the disclosed subject matter.

The repeating units of the nozzle architectures described in FIGS. 9-11 may be arranged in stacks that begin with a gas supply separator end plate, which is similar in design to the separator plate but with provisions to permit sealing to a gas and/or vacuum manifold. The stack could interface with a manifold at its other end or it could be sealed at the other end with a solid end plate as shown in FIG. 6g.

Figure 12:
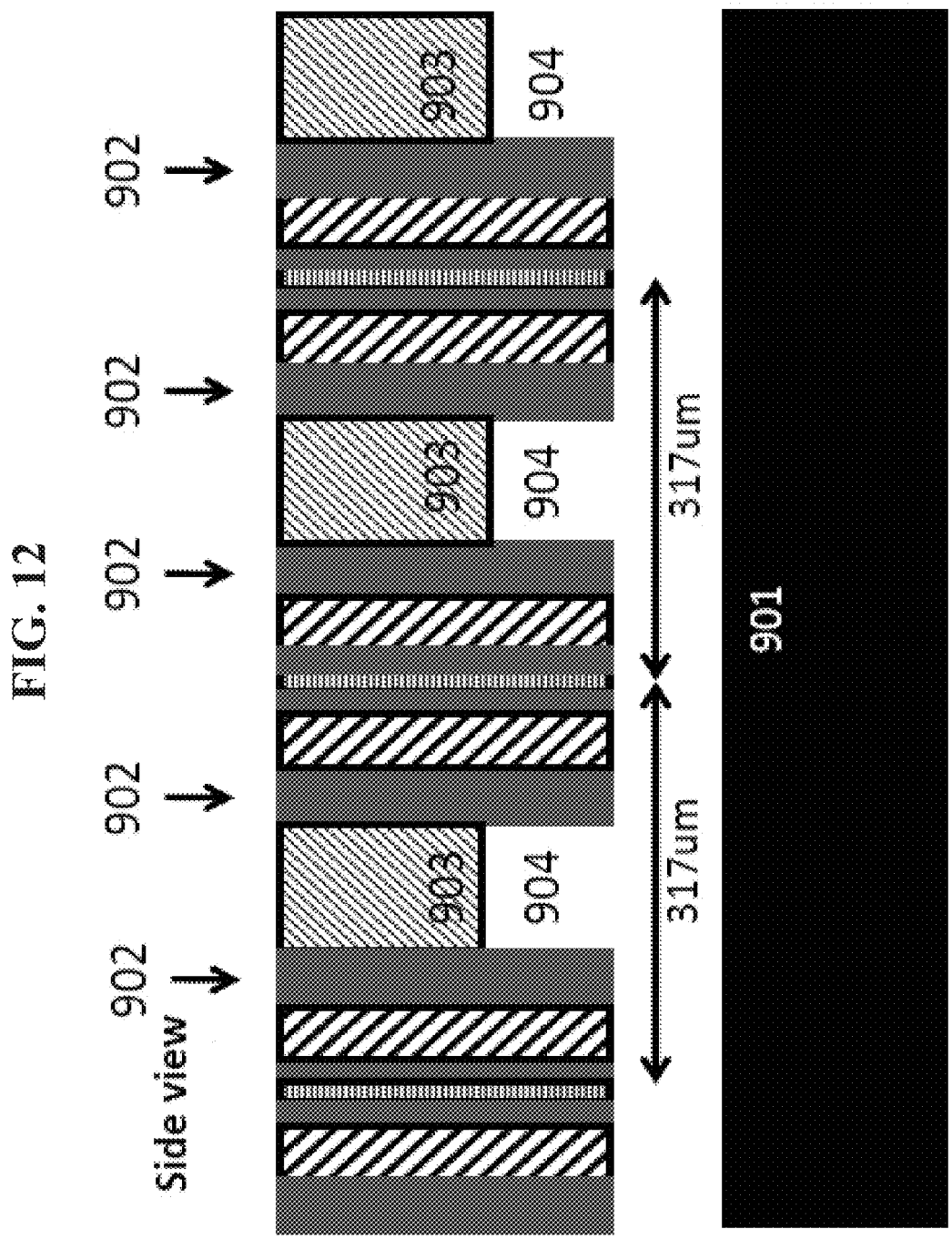
FIG. 12 shows a nozzle array that includes delivery, exhaust, and separator plates, where the separator plates provide a low impedance flow path to ensure that a reservoir

An embodiment of the disclosed subject matter, as shown in FIG. 12, provides a nozzle assembly including at least one nozzle having a first aperture formed along an edge of a first aperture plate to eject a carrier gas flow laden with condensable organic vapor onto a substrate in a deposition chamber. One or more second apertures are formed on second aperture plates disposed adjacent to and on opposite sides of the first aperture to form a vacuum aperture. The first aperture plate and the second aperture plates are separated by first separator plates. Second separator plates may be disposed adjacent to the second aperture plates, on an opposite side from the first separator plates. Third separator plates may be respectively disposed adjacent to each of the second separator plates opposite the second aperture plates, where the third separator plates are configured to define a roof of a channel for confinement gas to flow.

That is, if confinement gas is sourced from the chamber ambient instead of from a dedicated confinement gas path within the nozzle array, flow of confinement gas to the exhaust apertures can be enhanced using specialized separator plates as shown in FIG. 12. As in the example of FIG. 10, the nozzle array contains delivery, exhaust, and separator plates. In the case of large nozzle arrays, exhaust channels may be become starved for confinement gas near the center of the assembly and cease to effectively remove surplus organic material from the deposition zone. This issue may be reduced and/or mitigated with separator plates that provide a low impedance flow path to ensure that a reservoir of confinement gas is present along the entire length of each exhaust aperture. FIG. 12 shows a simple separator plate design to accomplish this. The 218 µm wide separator plates 530 (e.g., as shown in FIG. 10 as discussed above) are replaced with two 30 µm wide separator plates 902 that surround a single 158 µm wide separator plate 903. The single separator plate 903 is shorter than its neighbors by 300 µm. It is therefore not flush with its neighbors along the aperture bearing surface, so it defines the roof of a low impedance channel 904 for confinement gas to flow along paths parallel to the long dimension of the exhaust apertures. Confinement gas may be fed into low impedance channels 904 from ultra-high purity gas sources with outlets mounted along the edges of the parallel to the normal of the stacked plates. Deposition rate can be increased by combining multiple gas channels in a plate that is longer than a single gas channel plate (see, e.g., FIGS. 8a-8c). These longer plates would be stacked in the same manner as single aperture plates to form nozzles and nozzle assemblies.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of, kill in the art. It is understood that various theories as to why the invention works are not intended to be limiting.

We claim:

1. A nozzle assembly comprising:
    at least one nozzle having:
        a first aperture formed along an edge of a first aperture plate to eject a carrier gas flow laden with condensable organic vapor onto a substrate in a deposition chamber;
        one or more second apertures formed on a second aperture plate disposed adjacent to the first aperture to form a vacuum aperture, where the first aperture plate and the second aperture plate are separated by a first separator plate;
        one or more third apertures formed on a third aperture plate to eject purge gas that are disposed adjacent to the second aperture plate, where the second aperture plate and the third aperture plate are separated by second separator plate; and
        a third separator plate disposed adjacent to the one or more third aperture plates to form a gas channel in the one or more third aperture plates.

2. The nozzle assembly of claim 1, further comprising:
    a gap disposed between a stacked formation of the first, second, and third aperture plates and the substrate that direct the purge gas flow anti-parallel to the carrier gas flow, and into one or more exhaust apertures that are in communication with a vacuum source external to the deposition chamber.

3. The nozzle assembly of claim 1, wherein the nozzle for a single deposition aperture is formed by placing sheets of material formed to have the first, second, and third apertures along one edge and gas channels through the assembly.

4. The nozzle assembly of claim 3, wherein the nozzle for the single deposition assembly is formed by alternating aperture sheets, respectively having the first, second, and third apertures, and separator sheets to form gas flow paths from the gas channels to at least one of the first, second, and third apertures.

5. The nozzle assembly of claim 1, wherein the at least one nozzle is for multi-deposition apertures, and is formed by repeating placement of sheets of material formed to have apertures along one edge and gas channels through the assembly so that multiple deposition nozzles are formed, separated by a number of sheets.

6. The nozzle assembly of claim 5, wherein the number of nozzles is between 10 and 100.

7. The nozzle assembly of claim 5, wherein the number of nozzles is greater than 100.

8. The nozzle assembly of claim 1, wherein the at least one nozzle comprises:

an aperture plate, where each plate contains more than one aperture to deposit a single line.

9. The nozzle assembly of claim 1, wherein the at least one nozzle is for a single deposition nozzle assembly that is formed by placing sheets of material formed to have multiple apertures along one edge and gas channels through the assembly.

10. The nozzle assembly of claim 9, wherein the single deposition nozzle assembly formed by alternating multi-aperture sheets and separator sheets to form gas flow paths from the gas channels to the respective aperture.

11. The nozzle assembly of claim 9, wherein the single deposition nozzle formed by placing multi-aperture plates, with the respective plates having the first aperture, the one or more second apertures, the one or more third apertures, and the separator plates disposed between the respective plates, to form the at least one nozzle.

12. The nozzle assembly of claim 9, wherein the single deposition nozzle assembly comprises stacking more than one multi-aperture nozzle assembly to form a two-dimensional nozzle assembly.

13. The nozzle assembly of claim 1, further comprising:
a heater to heat the at least one nozzle to a temperature greater than that of the evaporation temperature of a least volatile organic species in the carrier gas.

14. The nozzle assembly of claim 1, further comprising:
a chiller plate oriented parallel to the substrate that surrounds the at least one nozzle.

15. The nozzle assembly of claim 1, wherein the deposition chamber ambient pressure is at least 10 Torr.

16. The nozzle assembly of claim 1, wherein the deposition chamber ambient pressure is at least 100 Torr.

17. The nozzle assembly of claim 1, wherein the deposition chamber ambient pressure is at least 760 Torr.

18. An OLED device made by a nozzle assembly including at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

19. The OLED device of claim 18, wherein the nozzle assembly includes a gap disposed between a stacked formation of the first, second, and third aperture plates and the substrate that direct the purge gas flow anti-parallel to the carrier gas flow, and into one or more exhaust apertures that are in communication with a vacuum source external to the deposition chamber.

20. A deposition system comprising an isolated chamber in which deposition is performed by using at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

* * * * *